United States Patent [19]

Adasko et al.

[11] Patent Number: 5,414,224

[45] Date of Patent: May 9, 1995

[54] MULTILAYER PRINTED CIRCUIT BOARD AND METHOD OF MANUFACTURING SAME

[75] Inventors: Vladimir I. Adasko, Moscow; Arnold K. Vardenburg, Istra; Alexandr L. Emelyanov, Moscow; Lev A. Seliverstov, Istra; Viktor L. Emelyanov, Moscow; Alexandr D. Slonimsky, Istra; Nikolai A. Sklyarov, Istra; Vladimir I. Tikhonov, Istra; Jury F. Rogozhin, Istra; Pogos M. Piliposian, Istra, all of Russian Federation

[73] Assignee: Filial Vsesojuznogo Nauchno Issledovatelskogo Instituta,

[21] Appl. No.: 972,450

[22] PCT Filed: Apr. 1, 1991

[86] PCT No.: PCT/SU91/00055

§ 371 Date: Jan. 29, 1993

§ 102(e) Date: Jan. 29, 1993

[87] PCT Pub. No.: WO92/17994

PCT Pub. Date: Oct. 15, 1992

[51] Int. Cl.⁶ ............................................. H05K 1/00
[52] U.S. Cl. ............................. 174/262; 174/255; 174/266
[58] Field of Search ............... 174/250, 255, 262, 263, 174/264, 265, 266; 428/901

[56] References Cited

U.S. PATENT DOCUMENTS

| Re. 29,784 | 9/1978 | Chadwick et al. |
|---|---|---|
| 3,296,099 | 1/1967 | Dinella ........................ 204/15 |
| 4,318,954 | 3/1982 | Jensen . |
| 4,496,793 | 1/1985 | Hanson ...................... 174/68.5 |
| 4,563,543 | 1/1986 | Kersuzan et al. . |
| 4,604,799 | 8/1986 | Fluke ........................ 204/15 |
| 4,651,417 | 3/1987 | Schumacher ................ 29/848 |
| 4,869,922 | 9/1989 | D'Agostino et al. . |
| 4,882,454 | 11/1989 | Peterson et al. . |
| 4,889,439 | 2/1990 | Potter et al. . |
| 5,194,196 | 3/1993 | Chance et al. . |

FOREIGN PATENT DOCUMENTS

| 0198928 | 10/1986 | European Pat. Off. . |
|---|---|---|
| 247575 | 12/1987 | European Pat. Off. . |
| 3518975 | 11/1986 | Germany . |
| 3520945 | 12/1986 | Germany . |

*Primary Examiner*—Leo P. Picard
*Assistant Examiner*—Cheryl R. Figlin
*Attorney, Agent, or Firm*—Ladas & Parry

[57] ABSTRACT

A metal base (1), and holes (12) therein, of a printed circuit board are given an insulating coat (2) produced from an epoxy compound in particulate form which is deposited and machined successively at either side. An insulating topology (16) in a photoresist imposed on the insulating coat (2) is metal-plated in vacuum. On removing the metal from the prominent portions of the topology (16) tracks (4) and connecting pads (5) of a layer (3) of conducting pattern are left. An insulating topology (18) consistent with the disposition of connecting pads (11) and connecting posts (10) interconnecting the layers (3, 6) of conducting patterns is formed and metal-plated. On removing the metal from the prominent portions an insulating layer (9) with connecting posts (10) and connecting pads (11) is left. Next, an insulating topology (19) consistent with the topology of the layer (6) of conducting pattern is formed and metal-plated. After machining, tracks (7) with connecting pads (8) of the layer (6) of conducting pattern are left.

9 Claims, 5 Drawing Sheets

FIG. 5A  FIG. 5K
FIG. 5B  FIG. 5L
FIG. 5C  FIG. 5M
FIG. 5D  FIG. 5N
FIG. 5E  FIG. 5O
FIG. 5F  FIG. 5P
FIG. 5G  FIG. 5Q
FIG. 5H  FIG. 5R
FIG. 5I  FIG. 5S
FIG. 5J

MULTILAYER PRINTED CIRCUIT BOARD AND METHOD OF MANUFACTURING SAME

TECHNICAL FIELD

The present invention relates to the manufacture of printed circuit boards and has specific reference to multilayer PCB's and methods of their manufacture.

PRIOR ART

Known in the art is a double-sided PCB on a metal base with mounting holes and holes for interconnections (U.S. Pat. No. 3,296,099). The metal base with holes drilled or punched in advance is given a coat of insulation and a coat of insulation is applied to the inside of the holes. The insulation serves as the substrate for a first and a second layer of conducting pattern. The mounting holes and those for the interconnections are metal plated and are used as conductors between the elements of the first and second layers of conducting patterns, if conditions warrant this.

Another multilayer PCB on a metal base is made by employing the through-hole plating method for establishing the interconnections between the elements of the layers of conducting patterns (U.S. Pat. No. 4,496,793). The metal base with a plurality of large diameter openings is given an insulating coat on both sides. Disposed at one side of the insulation is a double-sided PCB, and at the opposite side of the insulation there is imposed an outward layer of conducting pattern. The other outward layer of conducting pattern is applied to the double-sided PCB, being separated therefrom by an insulation. All the layers of conducting patterns, i.e. two inward and two outward, are interconnected by the through-plated holes made in the existing openings.

An alternative method of interconnecting the layers of conducting patterns relies on connecting posts as this is the case in another multilayer PCB (EPV; A; 0247,572,A2) the technical concept whereof can be regarded as a kind of the forerunner of the disclosed invention.

The known PCB comprises:
a metal base;
an insulating coat applied to the metal base;
a first layer of conducting pattern and at least one more layer of conducting pattern, whereby the first layer has metal tracks and its side facing the other layer is roughened. The other (second) layer of conducting pattern has tracks in a conducting polymer paste;
an insulating layer sandwiched between the first and second layers of conducting patterns;
a plurality of connecting posts in the conducting polymer paste which serve as interconnections between the first and second layers of conducting patterns.

Characterized by a more or less satisfactory interconnections between the electric and radio components, the known PCB is not free from shortcomings, such as;
inability to carry pin-mounted electric or radio components;
low packing density attributed to the use of the conducting polymer paste and the etching of foil;
lack of edge connectors which is a factor narrowing the field of application of the PCB.

The PCB referred to hereinabove in U.S. Pat. No. 3,269,099 is adapted to accommodate any electric or radio component at its surface. However, the packing density is low due to the reasons as follows. Firstly, bell-shaped recesses are formed around the holes in the course of applying the coat of insulation so that the connecting pads must be increased in size in order to reach the flat surface of the insulation with their outer edges. Secondly, the design features of the known board make it impossible to built up a multilayer assembly. Thirdly, the holes indispensable in providing the interconnections between the layers not only occupy much space by themselves but encroach upon extra space due to their bell-mounted ends. These factors have an adverse effect on the packing density.

The multilayer PCB on a metal base (U.S. Pat. No. 4,496,793) is of a design conductive to good packaging density of electric and radio components, the multilayer configuration and the planeness of the outer surface being the main beneficial factors. However, the packing density is impaired to some extent by the interconnecting through-plated holes, and the plurality of the holes in the metal base reduce the heat-dissipating ability of the base.

Known in the art is a method of manufacturing printed circuit boards (U.S. Pat. No. 4,651,417) which avoids electroless processing, except electroplating. Pursuant to this method, holes for interconnecting the layers of conducting patterns at a later stage are drilled in a base made from a thermoplastic material. The base is put in a press to form therein a network of grooves about 0.05 mm deep of the same configuration as that of a layer of conducting pattern. The base is given a 2-micron coat of copper, using magnetron sputtering, and is ground so that metal tracks are left in the grooves to form a layer of conducting pattern. Preparatory to the grinding, the coat of copper can be built up by electroplating.

By virtue of this method, multilayer PCB's may be built up by press-fitting polymer sheets with layers of conducting patterns to the surface of the base of the board. The connections between the layers are established by drilling and plating the through holes simultaneously with the plating the layers of conducting patterns.

Further known is a method of manufacturing multilayer printed circuit boards (EPV; A; 0247,675 A2) a salient feature whereof is a significant reduction of harmful waste. This method is to some extent the forerunner of the disclosed method in point of the technical concept.

In accordance with the known method, copper or aluminium foil is applied to a metal base, using an adhesive layer of insulation with a good adhesion in respect to both the material of the base and the foil. This, in its turn, is roughened for good adhesion with the overlaying layer. A first layer of conducting pattern is etched, using a known technique. An insulating layer is applied and windows are made therein for access to the first layer of conducting pattern at specified places. The insulating layer can be stencilled, using an insulating polymer paste, or its material can be a photoresist. The windows are filled with a conducting polymer paste which is allowed to polymerize. The surface of the board can be ground to remove possible contaminants and for levelling. A second layer of conducting pattern is stencilled, using the conducting polymer paste which is also allowed to polymerize. Finally, a nickel-boron alloy and then copper are electrolessly deposited upon the elements of the second layer of conducing pattern to enhance the solderability of the boards and make them immune against molten solder attacks.

The known method reduces the harmful waste, for some operations which are a source thereof are eliminated, and reduces the consumption of the costly foil-clad plastics. However, it is not free from disadvantages such as:

a significant spread in the geometric dimensions of elements of conducting patterns and connecting posts produced by stencilling which impairs the packing density and invites difficulties in establishing equalizing electric lines, reducing thereby the range of operating frequencies of the boards;

the operation of foil etching in shaping the first layer of conducting pattern and that of electroless nickel and copper plating not only bring about ionic contamination, reduce the insulation resistance and impair the quality of boards but are a source of harmful industrial waste.

The known method of manufacturing multilayer PCB's referred to above (U.S. Pat. No. 4,651,417) reduces the industrial waste to a minimum but fails to yield a reliable product due to the difficulties encountered in depositing a coat of metal of a given thickness by magnetron sputtering, especially inside the holes.

In fact, an average thickness, d, of the plating in a hole cannot be greater than as follows:

$$d \geq \frac{D}{4h} t,$$

when the plating is deposited from one end of the hole;

$$d \geq \frac{D}{2h} t,$$

when the plating is deposited from both ends of the hole.

This means that an average thickness of the plating inside a hole with a diameter D=0.9 mm of a board with a thickness h=1.5 mm which is deposited from both sides of the hole will not be greater than 0.6 micron, provided the thickness of the plating at the board surface t=2 microns, i.e. will be less than the average height of surface irregularities inside the hole. Therefore it is hardly feasible not only to secure a reliable electric contact but to built up a quality coating by electroplating eventually. The thickness of vacuum-deposited plating cannot be increased unless a number of specific problems concerning the adhesive strength of metal films applied to the base of a board in a polymer material and an improvement in the mechanical and electric properties of the plating are solved. Additional problems related to the plating of holes may appear if the known method is utilized in the manufacture of multilayer boards because of their thickness and the presence of a boundary between the base and overlaying layers.

SUMMARY OF THE INVENTION

The principal object of the invention is to provide a multilayer printed circuit board which is adapted to accommodate both surface- and pin-mounted electric and radio components, features a high packing density, good heat-dissipating ability and reliability and also to provide a method of manufacturing multilayer printed circuit boards which would ensure stability and reproducibility of the characteristics of the boards, significantly reduce the range of the chemicals required for their manufacture and the amount of harmful industrial waste so as to turn the process into an ecologically friendly one.

This object is realized in that in a multilayer printed circuit board with an insulation-clad metal base imposed whereupon is a first layer of conducting pattern comprising tracks and at least one additional layer of conducting pattern comprising tracks and connecting pads interposed wherebetween is an insulating layer supporting connecting posts which interconnect the tracks and connecting pads of the two layers of conducting patterns according to the invention the insulating coat is applied to the metal base at both sides thereof, and the first layer of conducting pattern is imposed on at least one surface of the insulating coat; coaxial through holes are provided in the layers of conducting patterns, the insulating layer and the metal base, whereby the diameter of the holes in the metal base is greater than that of the rest of the holes by a double thickness of the insulating coat applied to the inside of these holes; connecting pads of a thickness equalling the sum of the thickness of the layers of conducting patterns and that of the insulating layer are disposed contiguously to the edges of the holes in the layers of conducting patterns and the insulating layer and are surrounded by insulation, whereby a serrated outline of the end faces of all connecting pads contacts a similar outline of the edges of the insulation in the layers of conducting patterns and those of the insulating layer, and the insulating coat of the base and inside the holes is of a specified thickness which is the same over the entire surface area involved.

The multilayer printed circuit board of the disclosed design can be provided with edge connectors with strips the thickness each whereof equals the sum of the thickness of the layers of conducting patterns and that of the insulating layer, and a serrated outline of end faces of the strips contacts a similar outline of the edges of the insulation and those of the insulating layer.

It is expedient that the metal base is made from a metal with a low thermal expansion coefficient. The bases of the multilayer printed circuit boards used in electromechanical applications must be made from electrical steel.

The object of the invention is also realized in that in a method of manufacturing a multilayer printed circuit board—consisting of applying an insulating coat to a metal base, forming tracks of a first layer of conducting pattern on the insulating coat, placing an insulating layer with access windows to the first layer of conducting pattern at specified points, filling the windows with a conducting material so as to form connecting posts, machining the surface of the insulating layer, forming thereon tracks and connecting pads of a second layer of conducting pattern and connecting these tracks and connecting pads to the tracks of the first layer of conducting pattern by way of the connecting posts—according to the invention holes are provided in advance in the metal base and the insulating coat is applied to one side thereof and the insides of the holes; the surface of the insulating coat is machined, using the uncoated side of the metal base as the datum surface; the insulating coat is applied to the other side of the metal base which is also machined, using the machined side of the insulating coat as the datum surface, and connecting pads are additionally formed at the first layer of conducting pattern, whereby the tracks and connecting pads of the first and second layers of conducting patterns are deposited and the windows of the insulating layer are filled from vapour phase of a conducting material, the thickness of the deposited film being greater than 15 microns.

It is also expedient to use a photoresist containing epoxydiane oligomer with a molecular mass of 860 to 1070; oligoesteracrylate; a product of the esterification of 1 mole of dianepoxy oligomer (molecular mass, 860–1060) with 1–1.2 mole of methacrylic acid, 0.9 mole of sebacic acid and 0.1 mole of saturated aliphatic monocarboxylic acid with a molecular mass of 130–160; an initiator of photopolymerization; a solvent and functional additives as the material of the insulating layer, the relationship between the components being as follows, parts by mass:

dianepoxy oligomer, 7–15
oligoesteracrylate, 4–10
product of esterification of dianepoxy oligomer, 30–40
initiator of photopolymerization, 4–10
solvent, 20–40
functional additives, 5–20

It is further expedient to deposit under one tenth of the conducting material by magnetron sputtering under the conditions of a maximum voltage applied to the target and to deposit the balance by electron-beam evaporation and condensation under the conditions of a maximum rate of evaporation.

It is preferred to alternate the deposition of the conducting material with a cooling of the deposited film, terminating the deposition when the conducting material becomes heated to a maximum temperature and resuming the process in 1 to 10 minutes.

BRIEF DESCRIPTION OF THE DRAWINGS

A preferred embodiment of the disclosed invention will now be described by way of example with reference to the accompanying drawings, wherein

FIG. 5 illustrates an option of the process of manufacturing a multilayer printed circuit board with two layers of conducting patterns according to the invention.

PREFERRED EMBODIMENT OF THE INVENTION

Figure 1:
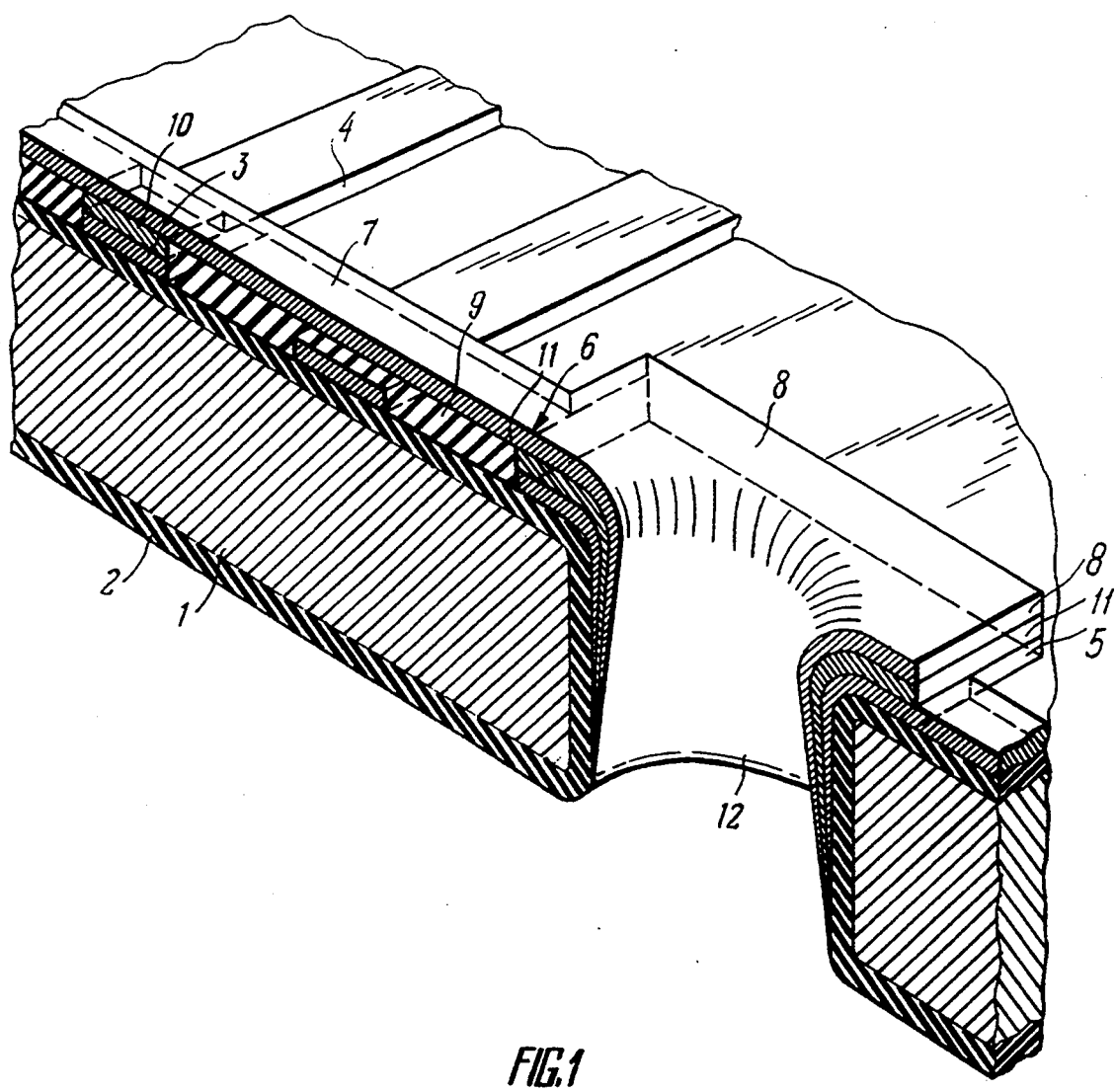
FIG. 1 illustrates a development of a design of a multilayer printed circuit board with two layers of conducting pattern according to the invention.
Figure 2:
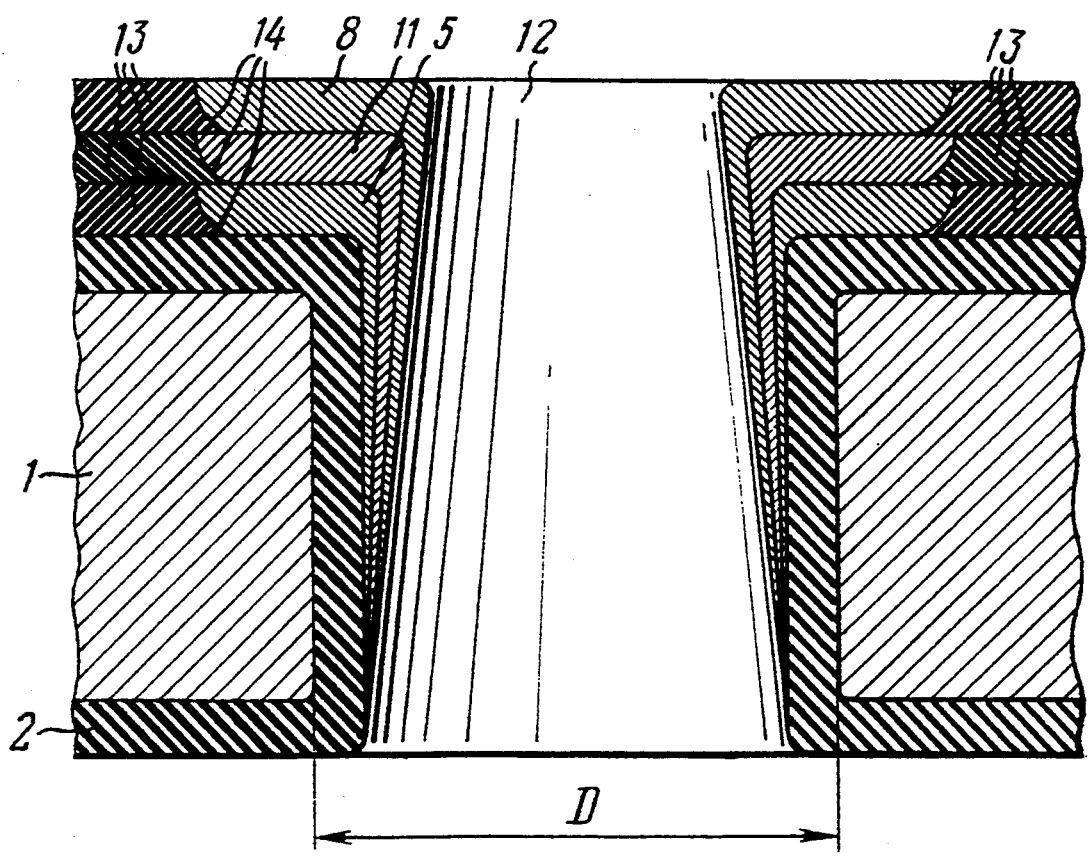
FIG. 2 illustrates the design of a connecting pad around a locating hole according to the invention.

Referring to FIG. 1, the multilayer printed circuit board has a metal base 1 given an insulating coat 2 at both sides. At one side of the insulating coat 2 there are formed a layer 3 of conducting pattern with tracks 4 and connecting pads 5 and a layer 6 of conducting pattern with tracks 7 and connecting pads 8. An insulating layer 9 with connecting posts 10 and connecting pads 11 is interposed between the layers 3 and 6 of conducting patterns. Coaxial through holes 12 are provided in the layers 3, 6 of conducting patterns, the insulating layer 9, the insulating coat 2 and the metal base 1. The diameter, D, (FIG. 2) of the holes 12 in the metal base 1 is greater than that of the rest of the holes 12 by a double thickness of the insulating coat 2 applied to their insides. Connecting pads 5, 8, 11 (FIG. 1) of a thickness equalling the sum of the thickness of the layers 3, 6 of conducting patterns and that of the insulating layer 9 are disposed contiguously to the edges of the holes 12 in the layers 3, 6 of conducting patterns and the insulating layer 9. The connecting pads 5, 8, 11 are surrounded by an insulation 13 (FIG. 2) and their end faces 14 of a serrated outline contact a similar outline of the edges of the insulation 13.

Figure 3:
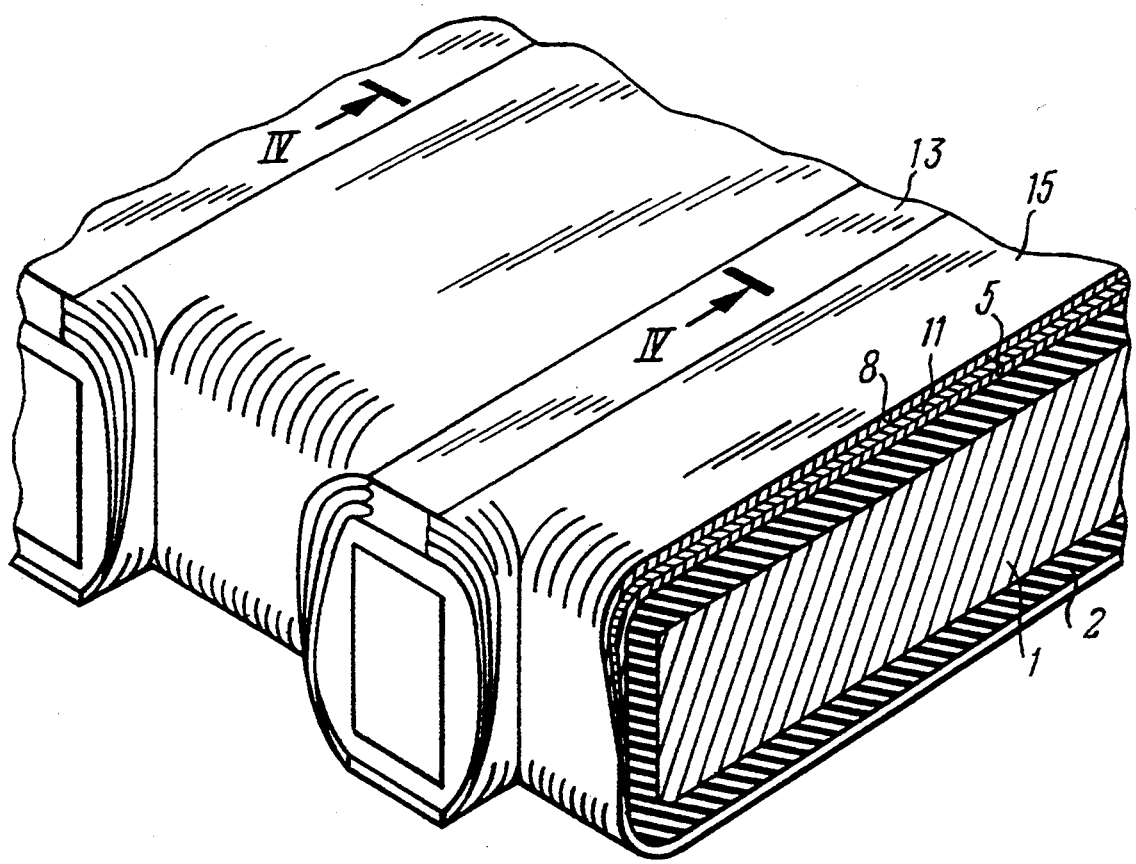
FIG. 3 illustrates the design of a board with strips of end connectors according to the invention.
Figure 4:
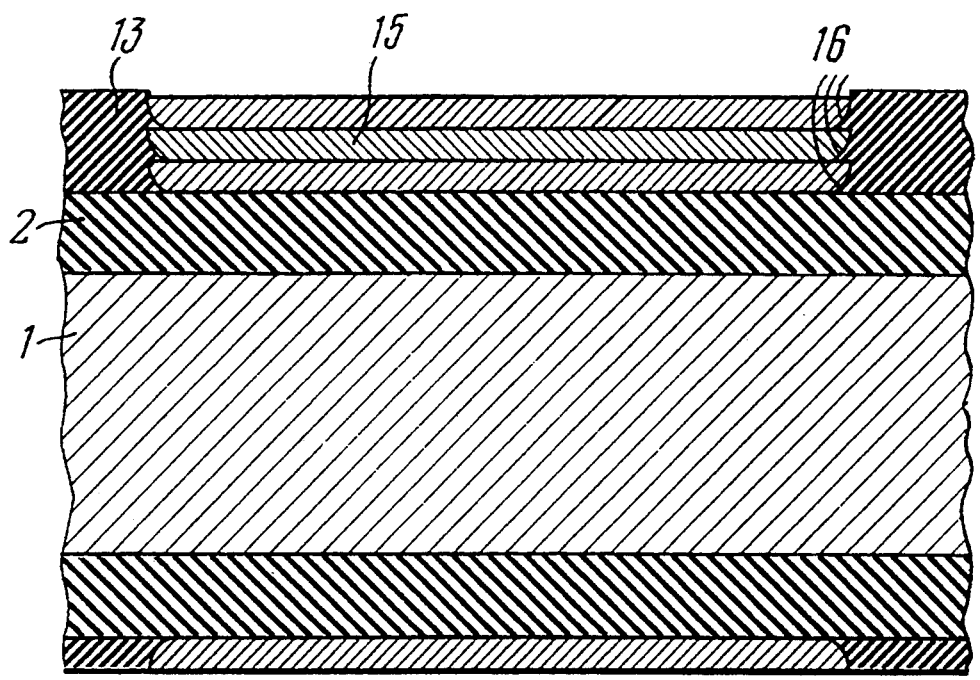
FIG. 4 illustrates a strip of end connectors in profile, being a section on line IV—IV of FIG. 3.

The multilayer printed circuit board can be provided with end connectors. Their strips 15 (FIG. 3) of a thickness equalling the sum of that of the layers 3, 6 (FIG. 1) of conducting layers and that of the insulating layer 9 have end faces 16 (FIG. 4) of serrated outline which contacts a similar outline of the edges of the insulation 13.

The disclosed method of manufacturing the multilayer printed circuit board is accomplished as follows.

Sheets of aluminium alloys, copper, alloys with a low temperature expansion coefficient or electrical steel are used as the material of the metal base 1. Blanks of a specified size are cut in a press, by a laser beam or using any other known technique preventing their distortion. The thickness of the blanks is determined by the design concept of the board or depends on the electromagnetic or other properties of the base 1.

Locating and mounting holes 12 (FIG. 5, A) are made simultaneously with cutting the blanks by the laser beam. The holes can be made in some other way, provided the blanks are not distorted.

The surface of the base 1 is cleaned, roughened to a certain extent and the edges of the holes 12 are rounded, using abrasive-water cleaning (FIG. 5, B). The abrasive used is, e.g., manufactured corundum with a particle size of 40 microns. A surface roughness, $R_a$, varying between 0.8 and 2.0 microns after the treatment ensures good adhesion of the coat to the base 1.

Preparatory to depositing the insulating coat 2 (FIG. 1), the locating holes are closed by special plugs. The insulating coat 2 of the metal base 1 is deposited from an epoxy powder compound of a composition by way of illustration as follows, parts by mass:

epoxy resin, 64
didiandiamide, 1.4
titanium dioxide, 30
polyvinylbutyral, 30
air-hardening sealant, the balance.

The air-borne powder is deposited electrostatically in an electric field of 4,000 to 5,000 V/cm and at a potential of 40,000 to 50,000 V across the high-voltage electrodes to form the coat 2 at one side of the base 1 and inside the holes 12. The other side of the base 1 is protected from the powder by special shields. The applied coat is heated to the melting point so that partial polymerization takes place. Another coat is deposited and polymerized at 180° C. for ½ h. The total thickness of the polymerized coat applied in two stages is 0.3 or 0.4 mm (FIG. 5, C).

Before machining the insulating coat 2 the untreated side of the base 1 is cleaned from the powder which has accidentally reached it.

The insulating coat 2 is ground to a thickness of 0.2 mm with a wheel with 40-micron grains operating at a speed of 2,500 rpm, using distilled water as the coolant (FIG. 5, D).

The same procedure is followed in applying the insulating coat 2 to the other side of the base 1, except that the polymerization lasts 1 h (FIGS. 5, E and F).

Mounting holes of a diameter which is by 0.40–0.45 mm less than that of the holes 12 in the metal base (FIG. 5, G) are drilled in the epoxy compound. This operation defines the thickness of the insulating coat 2 inside the holes 12.

The surface of the insulating coat 2, is roughened ($R_a = 0.5$ to 1.25 micron) and cleaned, together with the insides of the holes 12, from particles of the coat 2 left there after the grinding; also the edges of the holes are rounded. All these operations are carried out with the aid of abrasive-water cleaning.

The tracks 4 and the connecting pads 5 of the layer 3 of conducting pattern which has been coated with the epoxy compound in the second turn are formed, e.g. by screen printing, applying a photoresist (FIG. 5, H) of the following composition—in parts by mass—through the clear (without pattern) screen mesh:

epoxy resin, 10 oligoesteracrylate, 5 product of esterification of 1 mole of epoxy resin with mixture of 1.2 mole of methacrylic acid, 0.9 mole of cebacic acid and 0.1 mole of synthetic fatty acids of $C_7$–$C_9$ series, 37 mixture of benzophenone and Michler's ketone (1:1), 7 mixture of solvents, 30 functional additives (pigments, filling material, foam depressant and other), 11

A higher than specified content of the product of esterification and a lower content of the epoxy resin reduce the heat resistance of the coat 2. A lower content of the product of esterification impairs the adhesion of the coat 2. An increase in the content of the epoxy resin or a decrease in the content of the initiators of polymerization have an adverse effect on the light-sensitive property of the compound.

On being dried at a temperature not over 52° C., the 40- to 50-micron layer of the photoresist is exposed to light through a photomask holding the layer 3 of conducting pattern (FIG. 5, J).

The pattern is developed in an aqueous solution of ethyl cellosolve (15:85 parts by mass), and an insulating topology 16 so obtained (FIG. 5,K) is dried by a jet of air and then at 80° C. After an exposure to ultraviolet light, a heat treatment over the range between 120° and 200° C. follows, being carried out stepwise in four stages or gradually.

The insulating topology 16 can be formed by stencilling, provided the configuration of the layers 3 of conducting patterns permit this. Used in this case are known epoxy compounds commonly employed to prepare photomasks in the manufacture of printed circuit boards (FIG. 5,I).

The base 1 of the printed circuit board integrally with the insulating coat 2 and the insulating topology 16 is metal plated in vacuum, the coat 17 of metal being at least 15 microns thick (FIG. 5, L).

First, a copper substrate of about 1 micron thick is applied by magnetron sputtering under the conditions of a maximum voltage applied to the target which does not bring about an apparent reduction in the rate of deposition. This ensures an adequate adhesion of the metal to the insulating coat (2 N/cm).

The bulk of the copper is deposited by electron-beam evaporation at a maximum possible rate of evaporation in order to obtain a copper plating with satisfactory mechanical properties (an ultimate tensile strength of 450–510 N/mm² and an elongation at rupture of 2.0–2.6%).

To avoid overheating of the insulating coat 2 in the course of its plating with metal, the process is discontinued when the temperature of the insulating coat 2 reaches a permissible maximum. After a break not exceeding 10 min the process of plating is resumed. A pause between the evaporating cycles longer than 10 min reduces the rate of building up the plating which may laminate. However, too short breaks have an adverse effect on the properties of the metal and impair the metal utilization factor.

The layer 3 of conducting pattern is exposed by removing the plating from the prominent portions of the insulating topology 16, precision grinding being a suitable technique to that end (FIG. 5, M).

To form the insulating layer 9 with the windows filled with a conducting material shaped wherefrom are the connecting posts 10, the process is repeated. A layer of photoresist is exposed to light through a photomask of the connecting posts 10 so as to obtain an insulating topology 18 (FIG. 5, N) which is copper-plated and the plating is removed from the prominent portions of the insulating topology 18 by precision grinding (FIG. 5, O).

The layer 6 of conducting pattern is formed on the same lines. An insulating topology 19 consistent with the configuration of the layer 6 of conducting pattern (FIG. 5, P) is copper-plated and the metal is removed from the prominent portions of the pattern (FIG. 5, Q).

This arrangement comprising two layers of conducting tracks is an equivalent of a double-sided board which can be developed into a more complex system by building up a third layer of conducting pattern and further layers separated by insulating layers with connecting posts providing interconnections between the conducting layers.

The process of manufacturing the printed circuit board is finished by coating it with the photoresist referred to hereinabove to form a protective mask 20 (FIG. 5, R) and tinning the connecting pads (FIG. 5, S). On applying markings 21, the board is cut out all the way along the perimeter.

The disclosed invention provides for:

significantly reducing the harmful waste during the manufacture of printed circuit boards, for it eliminates the operations of electroless and electric plating, etching, etching-back and other operations so that there can be a practical possibility to create an ecologically-friendly process;

increasing the packing density owing to a reduction of the size of the connecting posts 10, the width of the tracks and that of the intervals therebetween, for any increase in the size of tracks during their building up by electroplating or etching them back while etching the pattern does not influence in the disclosed method the resolving power which is decided by the resolving power of the photographic technique only;

rendering the boards a reliable product, for all the connecting pads and the strips 15 of the edge connectors are of a robust design and securely mounted flush with the surface of the dielectric; there is also no danger of ionic contamination.

Industrial Applicability

The invention may be of utility in all those cases when traditional printed circuit boards in foilclad plastics are specified for use and strict nature-conservation requirements are in force.

The most promising field of application of the invention is in the manufacture of the printed circuit boards belonging to the following types:

carrying electric and radio components liberating significant heat;

incorporating equalizing electric lines;

used in electromechanical equipment;

employing both pinless ceramic electric and radio components and those which are pin-mounted.

What is claimed is:

1. A multilayer printed circuit board comprising:

a metal base, said base having a plurality of through holes in a pattern for accommodating leads of radio components, an insulating layer applied to at least one side of said base and to walls of said holes, said insulating layer and said base having substantially the same thickness, a first layer of electrically conductive material arranged in a pattern on said insulating layer and comprising a group of electrically conductive sections insulated from each other by insulating sections, said electrically conductive sections and said insulating section being of the same thickness, said electrically conductive sections comprising a group of tracks and a group of connecting pads, each pad of said group surrounding a corresponding through hole, some of said connecting pads being electrically coupled to other said connecting pads by tracks of said group, an insulating layer located on said pattern of said first layer of said conductive material and comprising a group of insulating sections and a group of electrically conductive sections in the form of a plurality of switching posts and connecting pads surrounding corresponding through holes of said group, said electrically conductive sections and said insulating sections being of identical thickness, said plurality of switching posts providing electrical connection of said tracks and said connecting pads in said pattern in said first layer of conductive material, an outer layer of conductive material arranged in a pattern on said insulating layer and including electrically conductive sections insulated from each other by insulating sections, said insulating sections and said electrically conductive sections being of the same thickness, said electrically conductive sections of the outer layer of the conductive pattern comprising a plurality of tracks and first and second groups of connecting pads, said first group of connecting pads surrounding corresponding through holes, said second group of connecting pads being connectable to surface-mounted radio components, the connecting pads surrounding the through holes having a thickness equal to the sum of the thicknesses of said layers of the conductive material and said insulating layers, and end faces of the superimposed connecting pads surrounding said through holes having projections, and end faces of corresponding insulating sections having indentations located opposite said projections and contacting the projections over the entire surface thereof.

2. The multilayer printed circuit board of claim 1, comprising a second layer of conductive material located on said insulating layer and a second insulating layer located on said second layer of conductive material.

3. The multilayer printed circuit board of claim 1, comprising at least one additional layer of conductive material located on said insulating layer and at least one additional insulating layer located on said additional layer of conductive material.

4. The multilayer printed circuit board of claim 3, comprising a group of strips arranged contiguous to an edge of each said layer of conductive material and each said insulating layer and electrically coupled by means of corresponding tracks from among said plurality of tracks connected to corresponding connecting pads.

5. The multilayer printed circuit board of claim 4, wherein said group of strips have end faces with projections, corresponding insulating sections have end faces with indentations located opposite said projections and in contact therewith over the entire surface thereof.

6. The multilayer printed circuit board of claim 5, wherein the thickness of said insulating layer has a deviation from a nominal value within the range of $+5\%$, while the thickness of said layers of conductive material and said insulating layers has a deviation from a nominal value within the range of $+10\%$.

7. The multilayer printed circuit board of claim 3, wherein the thickness of said insulating layer on said base and on said walls of the holes is the same.

8. The multilayer printed circuit board of claim 3, wherein said metal base is made of magnetic electrical-sheet steel.

9. The multilayer printed circuit board of claim 3, wherein said insulating sections are made of a photopolymer composition material.

* * * * *